(12) United States Patent
Soda et al.

(10) Patent No.: US 11,202,398 B2
(45) Date of Patent: Dec. 14, 2021

(54) ELECTROMAGNETIC SHIELDING MATERIAL AND METHOD FOR PRODUCING THE SAME

(71) Applicants: Murata Manufacturing Co., Ltd., Nagaokakyo (JP); Drexel University, Philadelphia, PA (US)

(72) Inventors: Yoshito Soda, Philadelphia, PA (US); Takeshi Torita, Philadelphia, PA (US); Yury Gogotsi, Ivyland, PA (US); Babak Anasori, Norristown, PA (US); Christine B. Hatter, Pennsauken, NJ (US)

(73) Assignees: MURATA MANUFACTURING CO., LTD., Nagaokakyo (JP); DREXEL UNIVERSITY, Philadelphia, PA (US)

( * ) Notice: Subject to any disclaimer, the term of this patent is extended or adjusted under 35 U.S.C. 154(b) by 158 days.

(21) Appl. No.: 16/140,751

(22) Filed: Sep. 25, 2018

(65) Prior Publication Data
US 2020/0029477 A1    Jan. 23, 2020

Related U.S. Application Data

(60) Provisional application No. 62/564,582, filed on Sep. 28, 2017.

(51) Int. Cl.
*H05K 9/00* (2006.01)
*B22F 1/00* (2006.01)
*B22F 9/24* (2006.01)

(52) U.S. Cl.
CPC ......... *H05K 9/0088* (2013.01); *H05K 9/0083* (2013.01); *B22F 1/0018* (2013.01);
(Continued)

(58) Field of Classification Search
CPC ........................... B22F 1/0018; H05K 9/0083
See application file for complete search history.

(56) References Cited

U.S. PATENT DOCUMENTS 9,550,206 B2    1/2017   Kagawa
2011/0160037 A1  6/2011   Youm et al.
(Continued)

FOREIGN PATENT DOCUMENTS

| JP | 2014103283 A | 6/2014 |
|---|---|---|
| KR | 20160137415 A | 11/2016 |
| WO | 2016049109 A2 | 3/2016 |

OTHER PUBLICATIONS

Li et al. (Ti3C2 MXenes modified with in situ grown carbon nanotubes for enhances electromagnetic wave absorption properties, J. Mater. Chem. C, 2017, 5, 4068-4074) (Year: 2017).*

(Continued)

*Primary Examiner* — Alexandre F Ferre
(74) *Attorney, Agent, or Firm* — Arent Fox LLP

(57) ABSTRACT

An electromagnetic shielding material that includes a plurality of layers, each layer having a crystal lattice represented by: $M_{n+1}X_n$ (wherein M is at least one metal of Group 3, 4, 5, 6, or 7; X is a carbon atom, a nitrogen atom, or a combination thereof; and n is 1, 2, or 3), each X is positioned within an octahedral array of M, and at least one of two opposing surfaces of said each layer has at least one modifier or terminal T selected from a hydroxy group, a fluorine atom, an oxygen atom, and a hydrogen atom; and dielectric and/or magnetic nanoparticles carried on a layer surface and/or between two adjacent layers of the plurality of layers.

10 Claims, 4 Drawing Sheets

(52) U.S. Cl.
CPC ............. *B22F 9/24* (2013.01); *B22F 2302/25* (2013.01); *B22F 2302/45* (2013.01)

(56) References Cited

U.S. PATENT DOCUMENTS

2015/0259546 A1   9/2015  Kagawa
2018/0338396 A1*  11/2018 Torita ................... H05K 9/0088

OTHER PUBLICATIONS

Han et al. (Ti3C2 MXenes with Modified Surface for High-Performance Electromagnetic Absorption and Shielding in the X-Band, ACS Appl. Mater. Interfaces 2016, 8, 21011-21019) (Year: 2016).*
Qing et al. (Titanium carbide (MXene) nanosheets as promising microwave absorbers, Ceramics International 42 (2016) 16412-16416) (Year: 2016).*
Li et al. (Ti3C2 MXenes modified with in situ grown carbon nanotubes for enhanced electromagnetic wave absorption properties, J. Mater. Chem. C, 2017, 5, 4068 (Year: 2017).*
Wang et al. (Facile synthesis SnO2 nanoparticle-modified Ti3C2 MXene nanocomposites for enhanced lithium storage application, J. Mater. Sci. 2016, 52:3556-3565). (Year: 2016).*
Shahzad, F. et al.; Electromagnetic interference shielding with 2D transition metal carbides (MXenes); Science, Sep. 9, 2016, vol. 353 Issue 6304, pp. 1137-1140.
Wang, Y. et al.; "Controlled synthesis of Fe3O4@SnO2/RGO nanocomposite for microwave absorption enhancement"; Ceramics International, Jul. 2016, vol. 42, Issue 9, p. 10682-10689.
Kumar, R. et al.; "Nickel nanoparticles embedded in carbon foam for improving electromagnetic shielding effectiveness"; Applied Nanoscience, Jun. 2015, vol. 5, Issue 5, pp. 553-561.

* cited by examiner

ELECTROMAGNETIC SHIELDING MATERIAL AND METHOD FOR PRODUCING THE SAME

CROSS REFERENCE TO RELATED APPLICATIONS

The present application claims priority to Provisional Patent Application No. 62/564,582, filed Sep. 28, 2017, the entire contents of which are incorporated herein by reference.

FIELD OF THE INVENTION

The present invention relates to an electromagnetic shielding material and a method for producing the same.

BACKGROUND OF THE INVENTION

An electromagnetic shielding has been used to prevent an electromagnetic wave (electromagnetic noise) generated from an electronic device from being spatially transmitted and causing another or the same electronic device to malfunction. As materials for forming the electromagnetic shielding (hereinafter simply referred to as "electromagnetic shielding materials"), electrically conductive materials such as metal and carbon have been heretofore used, and various electromagnetic shielding materials have been researched and developed with miniaturization, weight reduction, densification and the like of electronic devices.

For example, an electromagnetic shielding material using graphene, which is two-dimensional material, as an electrically conductive material is known. More specifically, a film material is known in which an electromagnetic wave absorbing layer containing graphene fine particles and a binder resin is formed on one surface of a plastic film (Patent Literature 1). In addition, a film material is known that is obtained by dispersing in a polymer a composite material in which magnetic particles (Fe) are dispersed in graphene (Patent Literature 2).

Regarding an electromagnetic shielding material, a result of studies for improving a shielding effect has been reported although the result is not directly related to graphene. For example, it has been reported that the shielding effect can be improved by embedding magnetic nanoparticles (Ni nanoparticles) in a lightweight carbon foam (Non Patent Literature 1). In addition, it has been reported that a microwave absorption capability can be improved by dispersing nanoparticles having a core-shell structure of $Fe_3O_4$—$SnO_2$ in a reduced graphene oxide (rGO) sheet (Non Patent Literature 2).
Patent Literature 1: JP 2014-103283 A
Patent Literature 2: KR 10-2016-0137415 A
Patent Literature 3: WO 2016/049109 A2
Non Patent Literature 1: Rajeev Kumar, et al., "Nickel nanoparticles embedded in carbon foam for improving electromagnetic shielding effectiveness", Applied Nanoscience, June 2015, Volume 5, Issue 5, pp. 553-561
Non Patent Literature 2: Yanping Wang, et al., "Controlled synthesis of $Fe_3O_4$@$SnO_2$/RGO nanocomposite for microwave absorption enhancement", Ceramics International, July 2016, Volume 42, Issue 9, pp. 10682-10689
Non Patent Literature 3: Faisal Shahzad, et al., "Electromagnetic interference shielding with 2D transition metal carbides (MXenes)", Science, 9 Sep. 2016, Vol. 353, Issue 6304, pp. 1137-1140

SUMMARY OF THE INVENTION

However, graphene has electrical conductivity in an in-plane direction of a two-dimensional sheet, but has a low electrical conductivity in the thickness direction. Therefore, in a film with graphene dispersed in a resin or a polymer, it is difficult to achieve conduction between graphenes, and thus electrical conductivity is reduced, so that a high shielding effect cannot be obtained. An electromagnetic shielding material is generally required to exhibit a shielding effect of 40 dB or more, preferably 50 dB or more, whereas the electromagnetic shielding material disclosed in Patent Literature 1 exhibits a shielding effect of only about 10 dB (the film thickness is unknown), and even the electromagnetic shielding material disclosed in Patent Literature 2 exhibits a shielding effect of only about 30 dB (the film thickness is 500 μm).

On the other hand, the electromagnetic shielding materials disclosed in Non Patent Literatures 1 and 2 exhibit a relatively high shielding effect, but are required to have a large thickness of about several millimeters. More specifically, the electromagnetic shielding material disclosed in Non Patent Literature 1 exhibits a total shielding effect (SET) of about 60 dB (about 50 dB as an absorption component (SEA) and about 10 dB as a reflection component (SER)) when Ni nanoparticles are embedded in the carbon foam, but the sample thickness is 2.75 mm (see FIG. 5(a); and lines 5 to 8, left column, page 556 in Non Patent Literature 1). It is understood that in the electromagnetic shielding material disclosed in Non Patent Literature 2, the microwave absorbing capability depends on a frequency, and in order to achieve a microwave reflection loss of about 30 dB, it is necessary to set the thickness of a sample (a forming material sample with a $Fe_3O_4$—$SnO_2$/rGO complex dispersed in paraffin at a mass ratio of 5:5) to about 4 mm (see FIGS. 8 (b) and 8(c) in Non Patent Literature 2).

In recent years, MXene has attracted attention as a novel material that has a high electrical conductivity and a high thermal conductivity (Patent Literature 3). MXene is one of so-called two-dimensional material and is a layered material, as will be described, comprising a plurality of layers, each layer having a crystal lattice which is represented by $M_{n+1}X_n$ (wherein M is at least one metal of Group 3, 4, 5, 6, or 7, X is a carbon atom and/or a nitrogen atom, and n is 1, 2, or 3), and in which each X is positioned within an octahedral array of M, and having a terminal (or modifier) T such as a hydroxy group, a fluorine atom, an oxygen atom, or a hydrogen atom on the surface of each layer. It has been reported that MXene has a high shielding effect (EMI SE) per unit thickness in the form of a film of a MXene alone or a film of a MXene-polymer composite (Non Patent Literature 3). More specifically, in both of the case of a film of $Ti_3C_2T_x$ alone, which is one of MXene, and the case of a film of a $Ti_3C_2T_x$-sodium alginate composite, a shielding effect of about 50 dB is achieved even with a film thickness of about 10 μm (see FIG. 4A in Non Patent Literature 3).

However, for sufficiently keeping up with further miniaturization, weight reduction, densification and the like of electronic devices, it is required to achieve a sufficiently high shielding effect with a smaller thickness, i.e., to further improve the shielding effect.

The present invention has been made to solve the above-mentioned problems of conventional techniques, and an object of the present invention is to provide an electromagnetic shielding material which uses MXene as an electrically conductive material and has an improved shielding effect, and a method for producing the electromagnetic shielding material.

According to one aspect of the present invention, there is provided an electromagnetic shielding material comprising:

(a) a layered material comprising a plurality of layers, each layer having a crystal lattice represented: $M_{n+1}X_n$ (wherein M is at least one metal of Group 3, 4, 5, 6, or 7, X is a carbon atom, a nitrogen atom, or a combination thereof, and n is 1, 2, or 3), each X is positioned within an octahedral array of M, and at least one of two opposing surfaces of said each layer has at least one modifier or terminal T selected from a hydroxy group, a fluorine atom, an oxygen atom and a hydrogen atom; and (b) dielectric and/or magnetic nanoparticles carried on a layer surface and/or between two adjacent layers of the plurality of layers. The electromagnetic shielding can also be referred to as an electromagnetic interference (EMI) shielding, and the electromagnetic shielding material of the present invention can be understood as an EMI shielding material.

In the electromagnetic shielding material of the present invention, dielectric and/or magnetic nanoparticles (hereinafter, simply referred to as "dielectric/magnetic nanoparticles" in this specification) are carried on the prescribed layered material (also referred to as "MXene" in this specification). When an electromagnetic shielding is formed using such an electromagnetic shielding material, nanoparticles are present between the layers of the layered material, and therefore electromagnetic waves internally reflected between the layers can be absorbed by means of the effect of a dielectric loss and/or magnetic loss, and resulting in improvement of the shielding effect.

In an embodiment of the present invention, the nanoparticles may be carried on the layer surface of the plurality of layers via the modifier or terminal T.

In an embodiment of the present invention, the nanoparticles may be composed of any one or a combination of two or more selected from titanium oxide, tin oxide, nickel, iron, cobalt and ferrite.

In an embodiment of the present invention, the electromagnetic shielding material may further comprise carbon nanotubes.

In place of or in addition to the above-mentioned embodiments, the electromagnetic shielding material may further comprise a medium in which the layered material is dispersed together with the nanoparticles. Such a medium may comprise a hydrophilic organic binder or a precursor thereof.

In an embodiment of the present invention, the electromagnetic shielding material may be in a form of a film. Alternatively, the electromagnetic shielding material may be in a form of a coating layer formed on a base material or a member to be shielded.

According to another aspect of the present invention, there is provided a first method for producing an electromagnetic shielding material, which comprises:

(i) preparing a dispersion in which at least dielectric and/or magnetic nanoparticles are dispersed in a liquid medium (or a flowable medium);

(ii) dispersing in the dispersion a layered material comprising a plurality of layers to create a mixture, each layer having a crystal lattice represented by:

$M_{n+1}X_n$ (wherein M is at least one metal of Group 3, 4, 5, 6, or 7, X is a carbon atom, a nitrogen atom, or a combination thereof, and n is 1, 2, or 3), and in which each X is positioned within an octahedral array of M, and at least one of two opposing surfaces of said each layer has at least one modifier or terminal T selected from a hydroxy group, a fluorine atom, an oxygen atom, and a hydrogen atom; and (iii) optionally at least partially removing the liquid medium from a mixture obtained in the step (ii) and comprising the layered material, the nanoparticles and the liquid medium, or at least partially curing the mixture.

In an embodiment of the present invention, the step (i) may comprise positively charging the dielectric and/or magnetic nanoparticles.

In an embodiment of the present invention, the step (i) carbon nanotubes are further dispersed in the liquid medium.

In an embodiment of the present invention, the liquid medium may comprise a hydrophilic organic binder or a precursor thereof.

According to still another aspect of the present invention, there is provided a second method for producing an electromagnetic shielding material, which comprises:

(iv) preparing a liquid matter comprising at least dielectric and/or magnetic precursor ions in a liquid medium;

(v) disposing in the liquid matter a layered material comprising a plurality of layers to create a mixture, each layer having a crystal lattice represented by: $M_{n+1}X_n$ (wherein M is at least one metal of Group 3, 4, 5, 6, or 7, X is a carbon atom, a nitrogen atom, or a combination thereof, and n is 1, 2, or 3), each X is positioned within an octahedral array of M, and at least one of two opposing surfaces of said each layer has at least one modifier or terminal T selected from a hydroxy group, a fluorine atom, an oxygen atom, and a hydrogen atom, and precipitating dielectric and/or magnetic nanoparticles by using the precursor ions; and (vi) optionally at least partially removing the liquid medium from a mixture obtained in the step (v) and comprising the layered material, the nanoparticles and the liquid medium.

In an embodiment of the present invention, the step (v) may be carried out by reducing the precursor ions, and for example, the reduction of the precursor ions may be performed in the presence of a reducing agent. In this embodiment, the precursor ions may comprise at least one selected from a nickel ion, an iron ion and a cobalt ion.

In an embodiment of the present invention, the step (iv) may further include carbon nanotubes in the liquid medium.

In an embodiment of the present invention, the second method for producing an electromagnetic shielding material may further comprise, after the step (v) and optionally the step (vi), (vii) dispersing the layered material and the nanoparticles in a hydrophilic organic binder.

According to the present invention, in an electromagnetic shielding material using MXene as an electrically conductive material, dielectric and/or magnetic nanoparticles are carried on MXene. When an electromagnetic shield is formed using such an electromagnetic shielding material, the nanoparticles are present between the layers of MXene, so that electromagnetic waves internally reflected between the layers can be absorbed by means of the effect of a dielectric loss and/or magnetic loss, and as a result, an electromagnetic shielding material having an improved shielding effect is provided. In addition, according to the present invention, a method for producing the electromagnetic shielding material is also provided.

DETAILED DESCRIPTION OF THE PREFERRED EMBODIMENTS

Figure 1:
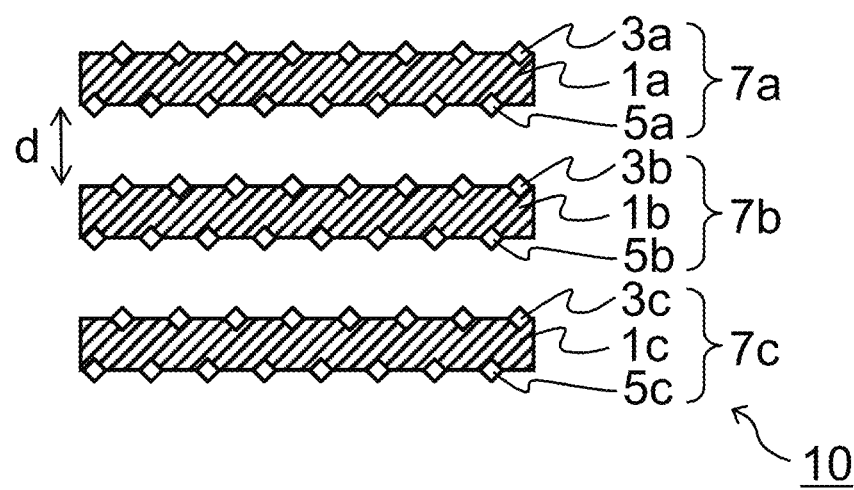
FIG. 1 is a schematic cross sectional view of MXene that is a layered material usable for an electromagnetic shielding material according to one embodiment of the present invention.

An electromagnetic shielding material and a method for producing the electromagnetic shielding material of the present invention will be described in detail through some embodiments, but the present invention is not limited to these embodiments.

Embodiment 1

An electromagnetic shielding material of the present embodiment includes:

(a) a prescribed layered material including a plurality of layers; and (b) dielectric and/or magnetic nanoparticles carried on a layer surface and/or between two adjacent layers of the plurality of layers.

A material usable as the prescribed layered material in the present embodiment is MXene, which is a layered material including a plurality of layers, each layer having a crystal lattice which is represented by:

wherein M is at least one metal of Group 3, 4, 5, 6, or 7 and may include at least one metal selected from the group consisting of so-called early transition metals, for example, Sc, Ti, Zr, Hf, V, Nb, Ta, Cr, Mo, and Mn, X is a carbon atom, a nitrogen atom, or a combination thereof, n is 1, 2, or 3, each X is positioned in an octahedral array of M, and at least one modifier or terminal T selected from the group consisting of a hydroxy group, a fluorine atom, an oxygen atom, and a hydrogen atom, preferably a hydroxy group, is present on at least one of two opposing surfaces of said each layer (this is also expressed as "$M_{n+1}X_nT_s$", wherein s is an arbitrary number, and conventionally, x may be used in place of s).

Such MXene can be obtained by selectively etching A atoms from an MAX phase. The MAX phase has a crystal lattice which is represented by the following formula:

(wherein M, X, and n are the same as described above; and A is at least one element of Group 12, 13, 14, 15, or 16, normally an element of A Group, typically of IIIA Group or IVA Group, more specifically at least one element selected from the group consisting of Al, Ga, In, Tl, Si, Ge, Sn, Pb, P, As, S, and Cd, and preferably Al, and in which each X is positioned in an octahedral array of M, and has a crystal structure in which a layer constituted by A atoms is positioned between layers represented by $M_{n+1}X_n$. The MAX phase schematically includes a repeating unit in which each one of layers of X atoms is disposed between adjacent layers of n+1 layers of M atoms (these are also collectively referred to as a "$M_{n+1}X_n$ layer"), and a layer of A atoms ("A atom layer") is disposed as a layer next to the (n+1)th layer of M atoms. The A atom layer is removed by selectively etching A atoms from the MAX phase. The exposed surface of the $M_{n+1}X_n$ layer is modified by hydroxy groups, fluorine atoms, oxygen atoms, hydrogen atoms, or the like present in an etching liquid (an aqueous solution of fluorine-containing acid is typically used, but not limited to this), and thus the surface is terminated.

For example, the MAX phase is $Ti_3AlC_2$, and MXene is $Ti_3C_2 T_s$.

In the present invention, MXene may contain remaining A atoms at a relatively small amount, for example, equal to or less than 10% by mass with respect to the original content of A atoms.

As schematically illustrated in FIG. 1, MXene 10 obtained in this way may be a layered material including two or more (although three layers are illustrated in the figure as an example, this is not limiting) MXene layers (these are also represented by "$M_{n+1}X_nT_s$", and s is an arbitrary number) 7a, 7b, and 7c obtained by modifying or terminating the surfaces of $M_{n+1}X_n$ layers 1a, 1b, and 1c with modifiers or terminals T 3a, 5a, 3b, 5b, 3c, and 5c. The MXene 10 may be a plurality of MXene layers which are separated and individually present (single-layer structure), a laminate in which a plurality of MXene layers are laminated with gaps interposed therebetween (multi-layer structure), or a mixture thereof. MXene may be an aggregation (may be also referred to as particles, powder, or flakes) of individual MXene layers (single layers) and/or laminates of MXene layers. In the case of the laminate, two adjacent MXene layers (for example, 7a and 7b, and 7b and 7c) do not need to be completely separated, and may be partially in contact with each other.

Although the following description is not given to limit the present embodiment, each layer of MXene (corresponding to the MXene layers 7a, 7b, and 7c described above) has a thickness of, for example, not less than 0.8 nm and not more than 5 nm, and particularly not less than 0.8 nm and not more than 3 nm (the thickness may vary depending mainly on the number of M atom layers included in each layer), and the maximum dimension of MXene in a plane parallel to the layer (two-dimensional sheet plane) is, for example, not less than 0.1 μm and not more than 200 μm, particularly not less than 1 μm and not more than 40 μm. In the case where MXene is a laminate, as to each individual laminate, the in-between distance of the layers (or a gap dimension indicated by d in FIG. 1) is, for example, not less than 0.8 nm and not more than 10 nm and particularly not less than 0.8 nm and not more than 5 nm, and yet particularly about 1 nm, and the total number of layers may be 2 or more, and, for example, is not less than 50 and not more than 100,000 and particularly not less than 1,000 and not more than 20,000, the thickness in the lamination direction is, for example, not less than 0.1 μm and not more than 200 μm and particularly not less than 1 μm and not more than 40 μm, and the maximum dimension in a plane (two-dimensional sheet plane) perpendicular to the lamination direction is, for example, not less than 0.1 μm and not more than 100 μm and particularly not less than 1 μm and not more than 20 μm. To be noted, these dimensions are obtained as number average dimensions (for example, number average of at least 40 samples) based on a scanning electron microscope (SEM) image or a transmission electron microscope (TEM) image.

MXene has a remarkably high carrier density (carrier concentration) and a high electrical conductivity in an in-plane direction, and also has a high electrical conductivity (for example, compared with graphene) in the thickness direction because MXene contains metal atoms M. With a high electrical conductivity in the thickness direction, conduction between MXene (single layers and/or laminates) is more likely to be achieved, and thus a high shielding effect can be achieved (for example, in either case of MXene alone or a film in which MXene is dispersed in an organic binder such as a resin or polymer). In particular, MXene is a layered material and has a high electromagnetic wave absorbing performance due to internal multiple reflection of electromagnetic waves. Further, since MXene contains metal atoms M, MXene also has a high thermal conductivity (for example, compared with graphene). In addition, MXene includes surface modifiers or terminals T that may be polar or ionic, and thus the surface thereof is highly hydrophilic. The contact angle of water on the surface of MXene may be, for example, 45° or less, and typically not less than 20° and not more than 35°.

Dielectric/magnetic nanoparticles usable in the present embodiment are particles composed of a material corresponding to at least one of a dielectric material and a magnetic material, and have an average particle size in nano-order or less. The average particle size of the dielectric/magnetic nanoparticles may be, for example, not less than 0.8 nm and not more than 50 nm, particularly not less than 0.8 nm and not more than 10 nm. To be noted, the average particle size is determined as a number average particle size (for example, a number average particle size of at least 40 samples) based on a scanning electron microscope (SEM) image or a transmission electron microscope (TEM) image.

Examples of the dielectric material that forms the dielectric/magnetic nanoparticles include materials having a relative dielectric constant of 10 or more, specifically titanium oxide and tin oxide. Examples of the magnetic material that forms the dielectric/magnetic nanoparticles include materials having a magnetic permeability of 100 or more, specifically nickel, iron and cobalt. Examples of the dielectric and magnetic material that forms the dielectric/magnetic nanoparticles include ferrite. Each of the dielectric material and the magnetic material may be either one having relatively high electrical conductivity (e.g., nickel, iron, cobalt or the like) or one having relatively low electrical conductivity (e.g., titanium oxide, tin oxide, ferrite or the like), but one having relatively high electrical conductivity is preferable. The dielectric/magnetic nanoparticles may be composed of one of these materials or a combination of two or more of these materials. In the latter case, the nanoparticles may have a core-shell structure, for example a core-shell structure of $Fe_3O_4$—$SnO_2$ or the like.

In the electromagnetic shielding material of the present embodiment, the dielectric/magnetic nanoparticles are carried on the layer surface and/or between two adjacent layers of the plurality of layers of MXene (i.e., MXene layers). As schematically shown in, for example, FIG. 2, dielectric/magnetic nanoparticles 11 (shown by black circles in the drawing) are carried on the layer surface of the MXene layers 7a, 7b and 7c and/or between two adjacent MXene layers 7a and 7b and between two adjacent MXene layers 7b and 7c in an electromagnetic shielding material (it is to be noted that it is not necessary that dielectric/magnetic nanoparticles are carried on the layer surface of all the existing layers and between every two adjacent layers). The dielectric/magnetic nanoparticles may be carried as described above, and may be carried on the layer surface of MXene layers via the modifier or terminal T (at least one of, and normally both of, the modifiers or terminals T 5a and 3b and 5b and 3c in FIG. 2) (here, T can be understood as a linking group or linking element rather than a terminal). This is because the modifier or terminal T is mainly negatively charged, so that the dielectric/magnetic nanoparticles can be effectively caught under an electrical action. The modifier or terminal T may be present periodically or regularly depending on the crystal structure of $M_{n+1}X_n$, and therefore it is possible to periodically or regularly carry the dielectric/magnetic nanoparticles at a position of the modifier or terminal T. That is, the dielectric/magnetic nanoparticles can be carried while being substantially uniformly dispersed in MXene. As the dielectric/magnetic nanoparticles, those that are easily caught by the modifier or terminal T can be selected. It is to be noted that graphene has no regularly disposed polar or ionic modifier or terminal etc., and therefore magnetic nanoparticles cannot be carried while being substantially uniformly dispersed.

In the electromagnetic shielding material of the present embodiment, MXene is used as an electrically conductive material. When the electromagnetic shielding material of the present embodiment is molded into a form of a film or coating layer under normal gravity for obtaining an electromagnetic shielding, MXene, either in the form of a single layer or a laminate, is easily aligned in such a manner that the two-dimensional sheet surface of MXene is generally parallel to a film base material or a surface to be coated, and thus MXenes as single layers and/or laminates are stacked as a whole. In addition, when MXene is a laminate, each laminate itself has a multilayer structure. Therefore, in an electromagnetic shielding formed using the electromagnetic shielding material of the present embodiment, internal multiple reflection of electromagnetic waves occur between the two adjacent layers (these layers may be close to each other, and may be in any combination selected from stacked single layers and/or layers of laminates) of MXene, so that a high electromagnetic wave absorbing capability is exhibited. Further, in the electromagnetic shielding material of the present embodiment, dielectric/magnetic nanoparticles are carried on MXene as described above, and therefore when the electromagnetic shielding material is exposed to electromagnetic waves, electromagnetic waves internally reflected between the layers can be brought into contact with the carried dielectric/magnetic nanoparticles, so that preferably, the chances of electromagnetic waves coming into contact with dielectric/magnetic nanoparticles can be increased due to multiple reflection specific to MXene. Due to the contact between the electromagnetic waves and the nanoparticles, one or both of electric field energy and magnetic field energy of the electromagnetic waves can be converted into heat, thus attenuated and absorbed by means of the effect of one or both of a dielectric loss and a magnetic loss depending on the material of dielectric/magnetic nanoparticles to be used (generated heat can be effectively dissipated by high thermal conductivity of MXene). As a result, electromagnetic waves reflected and transmitted by the electromagnetic shielding material can be reduced, so that a higher shielding effect (total shielding effect) can be obtained. In other words, a sufficiently high shielding effect, for example a shielding effect of 40 dB or more, preferably 50 dB or more, can be obtained with a smaller thickness, for example a thickness of 40 µm or less, particularly not less than 5 µm and not more than 20 µm.

It is concerned that in the absence of the dielectric/magnetic nanoparticles as described above, MXene has a higher ratio of a reflection component to the total shielding effect as compared to, for example, graphene (see, for example, FIG. 3F in Non Patent Literature 3; in the case of a film of $Ti_3C_2T_x$ alone, the reflection component occupies about 20 dB in the total shielding effect of 60 dB), reflected electromagnetic waves may cause damage to electronic devices etc. (more specifically, members that form an electronic circuit) in the electromagnetic shielding. On the other hand, according to the electromagnetic shielding material of the present embodiment, electromagnetic waves internally reflected between the layers are absorbed by dielectric/magnetic nanoparticles carried between the layers, whereby electromagnetic waves absorbed by the electromagnetic shielding material (absorption component) can be increased to reduce electromagnetic waves reflected by the electromagnetic shielding material (reflection component), i.e., reduce the ratio of the reflection component to the total shielding effect, and therefore influences on electronic devices etc. in the electromagnetic shielding can be effectively reduced or prevented.

In addition, in the electromagnetic shielding material of the present embodiment, dielectric/magnetic nanoparticles can be periodically or regularly carried at the position of the modifier or terminal T, and carried while being substantially uniformly dispersed in MXene, so that a shielding effect controlled as desired can be obtained.

Further, by adjusting the dielectric constant and/or magnetic permeability of dielectric/magnetic nanoparticles, the shielding characteristics of the electromagnetic shielding material of the present embodiment can be made selective in terms of a frequency, and for example, the attenuation amount can be changed depending on the frequency of electromagnetic waves. In addition, by adjusting the dielectric constant and/or magnetic permeability of dielectric/magnetic nanoparticles, the resonance frequency can be controlled to a desired level. Adjustment of the dielectric constant and/or magnetic permeability of dielectric/magnetic nanoparticles can be performed by, for example, adjusting the blending ratio of dielectric nanoparticles having a certain dielectric constant and magnetic nanoparticles having a certain magnetic permeability.

The ratio of carried dielectric/magnetic nanoparticles is not particularly limited, but may be, for example, not less than 0.1 parts by mass and not more than 30 parts by mass, particularly not less than 1 part by mass and not more than 15 parts by mass, based on 100 parts by mass of MXene.

Figure 6:
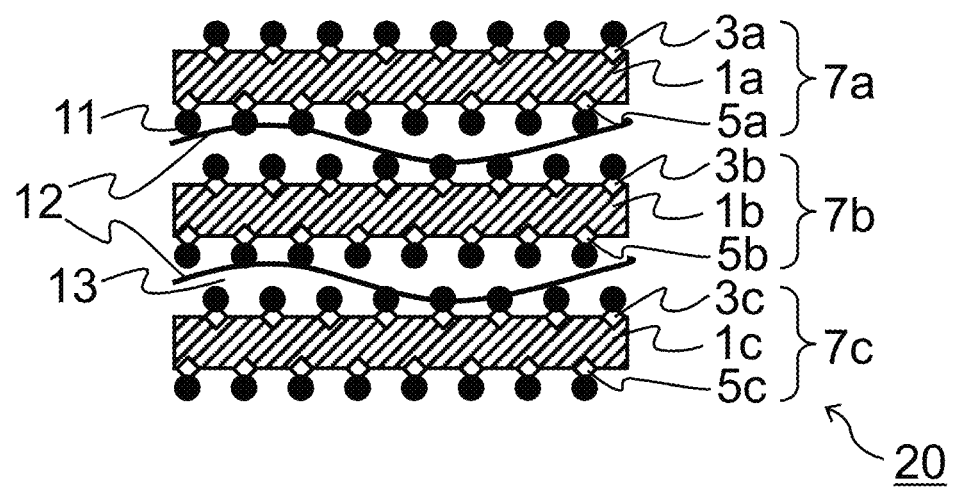
FIG. 6 is a schematic cross sectional view illustrating an electromagnetic shielding material in a further embodiment of the present invention, the electromagnetic shielding material having dielectric/magnetic nanoparticles carried on MXene as a layered material along with carbon nanotubes.

In addition, the electromagnetic shielding material of the present embodiment may further contain other components. For example, as shown in FIG. 6, the electromagnetic shielding material 20 may further contain carbon nanotubes 12. Carbon nanotubes are each a material formed in a tube shape from a single layer or multiple layers of graphene sheets, and has a diameter (outer diameter) in the order of nanometers or less. By adding carbon nanotubes 12, the electrical conductivity of the electromagnetic shielding material 20 can be kept high even when the dielectric/magnetic nanoparticles are carried. The carbon nanotubes 12 may be carried on the surface and/or between two adjacent layers of a plurality of layers 7a, 7b, 7c of MXene as in the case of the dielectric/magnetic nanoparticles 11 described above. Although the dimension of the carbon nanotubes may be selected as appropriate, the average diameter thereof may be, for example, not less than 0.5 nm and not more than 200 nm and particularly not less than 1 nm and not more than 50 nm, and the average length thereof may be, for example, not less than 0.5 µm and not more than 200 µm and particularly not less than 1 µm and not more than 50 µm. To be noted, these dimensions are obtained as number average dimensions (for example, number average of at least 40 samples) based on a scanning electron microscope (SEM) image or a transmission electron microscope (TEM) image.

The ratio of carried carbon nanotubes is not particularly limited, but may be, for example, not less than 1 part by mass and not more than 50 parts by mass and particularly not less than 1 part by mass and not more than 10 parts by mass, based on 100 parts by mass of MXene.

Figure 2:
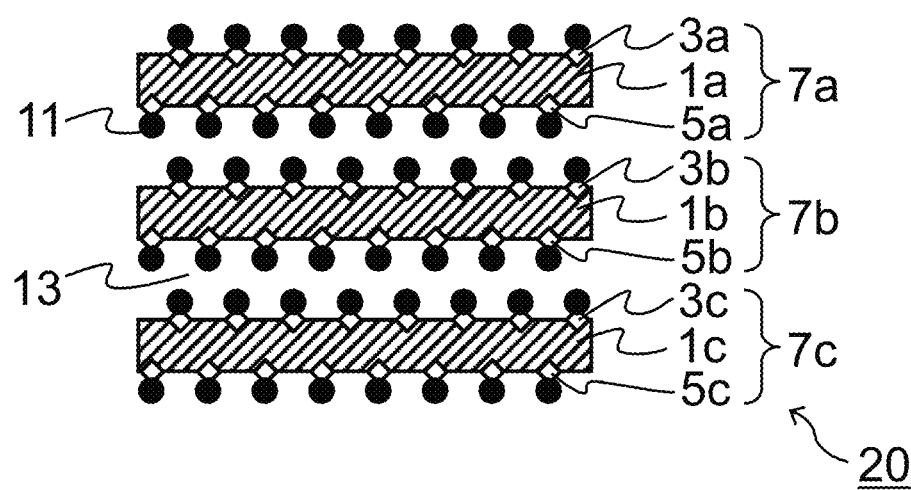
FIG. 2 is a schematic cross sectional view illustrating an electromagnetic shielding material in one embodiment of the present invention, the electromagnetic shielding material having dielectric/magnetic nanoparticles carried on MXene as a layered material.

In addition, for example, the electromagnetic shielding material may contain any suitable liquid or solid medium and any suitable additives (e.g., viscosity modifier, curing agent and so on) dispersed in such a medium. As schematically shown in FIG. 2, MXene layers 7a, 7b and 7c may be dispersed together with the dielectric/magnetic nanoparticles 11 in a medium 13.

The medium may contain, for example, a hydrophilic organic binder or a precursor thereof. When a hydrophilic organic binder or a precursor thereof is used, wettability on MXene having a hydrophilic surface is improved, so that MXene is easily dispersed in the organic binder, and the organic binder or precursor thereof is easily impregnated between the layers of MXene. When the organic binder or precursor thereof is impregnated between the layers of MXene, the in-between distance of the respective layers of MXene can be increased, but this in not limiting.

Examples of the hydrophilic organic binders include polymers such as polypyrrole, (meth)acrylic resin, and cellulose, thermosetting resins such as polyvinyl butyral and polyester, and curable resins such as phenol-curable epoxy resin and polyurethane. These polymers (or polymeric materials) and/or resins may contain other monomer units and any suitable substituents and/or modifying groups. As the precursor of the hydrophilic organic binder, for example, a monomer such as pyrrole can be used.

The medium may contain an aqueous liquid medium (e.g., water, or any suitable aqueous composition) and/or a hydrophilic organic liquid medium (e.g., alcohol, typically ethanol, methanol or the like) in place of or in addition to the hydrophilic organic binder or precursor thereof, and these media have good wettability on MXene having a hydrophilic surface, so that MXene is easily dispersed in these media, and these media are easily impregnated between the layers of MXene.

When the medium is a solid medium (e.g., a medium obtained by performing solidification through removal, curing or the like of the liquid medium), the electromagnetic shielding material may be in the form of a film. The film may be a free standing film, but is not limited thereto.

When the medium is a liquid medium, the electromagnetic shielding material may be in the form of a dispersion or paste in which dielectric/magnetic nanoparticles are dispersed in the liquid medium. The electromagnetic shielding material is applied to a base material (e.g., carrier film) (by, for example, coating, immersion or spraying), and solidified by removal, curing or the like of the liquid medium, whereby the electromagnetic shielding material can be used in the form of a coating layer formed on the base material. Alternatively, the electromagnetic shielding material is applied to a member to be shielded (e.g., electronic device, electronic component, electronic circuit board or the like) (by, for example, coating, immersion or spraying), and solidified by removal, curing or the like of the liquid medium, whereby the electromagnetic shielding material can be used in the form of a coating layer formed directly on the member to be shielded.

Embodiment 2

The present embodiment relates to one method for producing the electromagnetic shielding material described in Embodiment 1. In the present embodiment, dielectric/magnetic nanoparticles prepared beforehand are used. Those that have been described in Embodiment 1 also apply to the present embodiment unless any particular description is given.

First, a dispersion with at least dielectric/magnetic nanoparticles dispersed in a liquid medium is prepared. The same dielectric/magnetic nanoparticles as described in Embodiment 1 can be used. The liquid medium may be any of a hydrophilic organic binder or a precursor thereof, an aqueous liquid medium and a hydrophilic organic liquid medium, or a mixture of two or more thereof, and may contain an additive or the like as appropriate. A dispersion with dielectric/magnetic nanoparticles and carbon nanotubes dispersed in a liquid medium may also be prepared. The content ratio of the dielectric/magnetic nanoparticles, and the content ratio of the carbon nanotubes if present, in the dispersion can be appropriately selected according to a shielding effect that is ultimately desired.

Next, MXene is dispersed in the dispersion prepared as described above. More specifically, the dispersion prepared as described above and MXene are mixed to disperse MXene in the dispersion, and the dispersion is impregnated between the layers of MXene. At this time, MXene may be dispersed in the liquid medium beforehand, and then mixed with the dispersion prepared as described above.

Since the liquid medium that forms the dispersion is hydrophilic or aqueous, the liquid medium has a good wettability on MXene having a hydrophilic surface, and thus MXene can be easily dispersed in the liquid medium (even without any dispersing agent), and the liquid medium can be easily impregnated between the layers of MXene. Accordingly, the dielectric/magnetic nanoparticles in the dispersion, together with the liquid medium, can be easily supplied to the surface of layers and/or between two adjacent layers in MXene. It is preferable to use a hydrophilic organic binder or a precursor thereof as the liquid medium because subsequent molding (e.g., film molding) is easy.

As the dielectric/magnetic nanoparticles, those that are easily caught by the modifier or terminal T can be selected. In the present embodiment, for example, positively chargeable dielectric/magnetic nanoparticles are used and positively charged in a dispersion through any suitable method, and then MXene is further dispersed in the dispersion, so that the positively charged dielectric/magnetic nanoparticles can be easily caught by a principally negatively charged modifier or terminal T. Typically, particles with at least a surface composed of titanium oxide, ferrite or the like are used as dielectric/magnetic nanoparticles, and the dispersion is made acidic by a pH adjusting agent (e.g., hydrochloric acid or potassium hydroxide) etc., whereby the surface of the titanium oxide, ferrite or the like can be positively charged.

In addition, by using a hydrophilic or cationic monomer as the precursor of a hydrophilic organic binder in the liquid medium, dielectric/magnetic nanoparticles can be easily caught by a principally negatively charged modifier or terminal T. For example, by preparing beforehand a dispersion with dielectric/magnetic nanoparticles dispersed in a hydrophilic or cationic monomer (here, it is not necessarily required that the dielectric/magnetic nanoparticles are polar/charged), and then MXene is further dispersed in the dispersion, so that a monomer having a positive charge is easily caught by a principally negatively charged modifier or a terminal T. At this time, the monomer having a positive charge is accompanied by the dielectric/magnetic nanoparticles, and as a result, the dielectric/magnetic nanoparticles can be caught by the modifier or terminal T together with the monomer. Typically, pyrrole can be used as the precursor of a hydrophilic organic binder.

In any case, the modifier or terminal T may be present periodically or regularly depending on the crystal structure of $M_{n+1}X_n$, and therefore it is possible to periodically or regularly carry the dielectric/magnetic nanoparticles at a position of the modifier or terminal T. That is, the dielectric/magnetic nanoparticles can be carried while being substantially uniformly dispersed in MXene.

The thus-obtained mixture containing MXene, the dielectric/magnetic nanoparticles and the liquid medium can be used as an electromagnetic shielding material in the form of a dispersion or a paste.

Alternatively, thereafter the electromagnetic shielding material may be optionally molded into a form of a film by at least partially removing the liquid medium from the mixture obtained by the above-mentioned operation and containing MXene, the dielectric/magnetic nanoparticles and the liquid medium (e.g., removing the liquid medium by drying), or at least partially curing the mixture (e.g., curing the organic binder, or curing the precursor of the organic binder (curing may include polymerization)). The electromagnetic shielding material may be obtained in the form of a coating layer by performing the above-mentioned operation on a base material or a member to be shielded.

Under normal gravity, MXene dispersed in the liquid medium, when being in the form of either a single layer or a laminate, is easily aligned in such a manner that the two-dimensional sheet surface is generally parallel, and thus MXenes as single layers and/or laminates may be stacked.

Thus, an electromagnetic shielding material with dielectric/magnetic nanoparticles carried on MXene is produced.

Embodiment 3

The present embodiment relates to another method for producing the electromagnetic shielding material described in Embodiment 1. In the present embodiment, dielectric/magnetic nanoparticles are precipitated on the surface of MXene layers or in the vicinity thereof. Those that have been described in Embodiments 1 and 2 also apply to the present embodiment unless any particular description is given.

First, a liquid matter containing at least dielectric/magnetic precursor ions in a liquid medium is prepared. As a dielectric/magnetic precursor ion, any suitable ion may be used as long as dielectric/magnetic nanoparticles can be precipitated in the following. The liquid medium may be an aqueous liquid medium, a hydrophilic organic medium, or a mixture of two or more thereof, and may contain an additive or the like as appropriate. A liquid matter containing dielectric and/or magnetic precursor ions and carbon nanotubes in a liquid medium may be prepared. The content ratio of the dielectric/magnetic precursor ions, and the content ratio of the carbon nanotubes if present, in the liquid can be appropriately selected according to a shielding effect that is ultimately desired.

Next, MXene is disposed in the liquid matter prepared as described above, and dielectric/magnetic nanoparticles are precipitated by using precursor ions.

Since the liquid medium that forms the liquid matter is hydrophilic or aqueous, the liquid medium has a good wettability on MXene having a hydrophilic surface, and thus MXene can be easily dispersed in the liquid medium (even without any dispersing agent), and the liquid medium can be easily impregnated between the layers of MXene. Accordingly, the precursor ions in the liquid matter, together with the liquid medium, can be easily supplied to the surface of layers and/or between two adjacent layers in MXene to precipitate dielectric/magnetic nanoparticles at such sites. It is preferable to use an aqueous liquid medium as the liquid medium because it is stable as a reaction field.

More specifically, when dielectric/magnetic precursor ions are used, dielectric/magnetic nanoparticles can be precipitated by reducing the precursor ions. For example, when cations such as metal ions are used as precursor ions in the present embodiment, the cation precursor ions are easily caught by the modifier or terminal T of MXene because the modifier or terminal T of MXene is principally negatively charged. Further, since the modifier or terminal T has catalytic activity, the precursor ions are easily reduced on the modifier or terminal T, so that dielectric/magnetic nanoparticles can be precipitated in situ. The modifier or terminal T may be present periodically or regularly depending on the crystal structure of $M_{n+1}X_n$, and therefore it is possible to periodically or regularly carry the dielectric/magnetic nanoparticles at a position of the modifier or terminal T. That is, the dielectric/magnetic nanoparticles can be carried while being substantially uniformly dispersed in MXene.

Here, the precursor ions may be ions capable of precipitating dielectric/magnetic nanoparticles, and may include, for example, at least one selected from the group consisting of a nickel ion, an iron ion and a cobalt ion, and the magnetic nanoparticles precipitated therefrom are particles containing nickel, iron and cobalt, respectively. The precursor ion source may be an ion bonding compound including the above-mentioned precursor ions, for example, a sulfate, and precursor ions can be generated by dissolving the ion bonding compound in a liquid medium, preferably an aqueous liquid medium (solvent).

Reduction of precursor ions may be performed in the presence of a reducing agent, although any suitable method is applicable. As the reducing agent, for example, hydrazine can be used. More specifically, when such a reducing agent is added to a dispersion liquid in which MXene is dispersed in an aqueous liquid medium, and in which a sulfate (e.g., nickel sulfate) capable of generating precursor ions is dissolved in the aqueous liquid medium (solvent), the reducing agent is oxidized and the precursor ions are reduced on the above-mentioned modifier or terminal T (having catalytic activity) of MXene, so that magnetic nanoparticles are precipitated.

The thus-obtained mixture containing MXene, the dielectric/magnetic nanoparticles and the liquid medium can be used as an electromagnetic shielding material in the form of a dispersion or a paste.

Alternatively, thereafter the electromagnetic shielding material may be optionally molded into a form of a film by at least partially removing the liquid medium from the mixture obtained by the above-mentioned operation and containing MXene, the dielectric/magnetic nanoparticles and the liquid medium (e.g., removing the liquid medium by drying). The electromagnetic shielding material may be obtained in the form of a coating layer by performing the above-mentioned operation on a base material or a member to be shielded.

Alternatively, the MXene and dielectric/magnetic nanoparticles obtained by the above-mentioned operation may be dispersed in a hydrophilic organic binder. Here, the electromagnetic shielding material may be molded into a form of a film by adding a hydrophilic organic binder to the thus-obtained mixture containing MXene, the dielectric/magnetic nanoparticles and the liquid medium (preferably an aqueous liquid medium), optionally at least partially removing the liquid medium from the mixture (addition of the organic binder and removal of the liquid medium may be performed sequentially in any order, at the same time, or in a partially overlapping manner), and at least partially removing the liquid medium if remaining (e.g., removing the liquid medium by drying) from the mixture, or curing the mixture (e.g., curing the organic binder). The electromagnetic shielding material may be obtained in the form of a coating layer by performing the above-mentioned operation on a base material or a member to be shielded.

Thus, an electromagnetic shielding material with dielectric/magnetic nanoparticles carried on MXene is produced.

However, the electromagnetic shielding material described in Embodiment 1 is not limited to be produced by the production method described in Embodiment 2 or 3, and may be produced via any other appropriate method.

EXAMPLES

Example 1

A commercially available ferrofluid EMG 508 (manufactured by Ferrotec Corporation) was prepared as a dispersion with dielectric/magnetic nanoparticles dispersed in a liquid medium. The ferrofluid is a colloidal dispersion containing 1.2% by volume of particles (nominal particle size 10 nm) of magnetite ($Fe_3O_4$), which is one of ferrite, in a water medium. The ferrofluid had a black-brown appearance, included an anionic surfactant, and had a density of 1.07 g/cc at 25° C.

On the other hand, a dispersion containing $Ti_3C_2T_s$ as MXene in water was obtained in the following manner.

First, 1 g of $Ti_3AlC_2$ synthesized in accordance with the procedure disclosed in Patent Literature 3 was immersed in an etching liquid obtained by mixing 1 g of LiF and 10 cc of 6 mol/L hydrochloric acid, so that $Ti_3AlC_2$ was subjected to etching. The etching was performed for 24 hours while the etching liquid was kept at 35° C., and stirred by a magnetic stirrer. After the etching, the deposit thus obtained was washed with water to obtain $Ti_3C_2T_s$ in the form of a clay-like material.

Then, 50 mg of the clay-like $Ti_3C_2\,T_s$ thus obtained was weighed in a container, 10 mL of water was added thereto, and dispersion was performed by an ultrasonic cleaner (Heated Ultrasonic Cleaner, manufactured by SHARP-ERTEK) to prepare a dispersion liquid containing $Ti_3C_2\,T_s$ in water (hereinafter, referred to simply as a "$Ti_3C_2\,T_s$-aqueous dispersion liquid"). The ultrasonic cleaning was performed for 1 hour while the above-mentioned container was cooled in an ice-water bath. After the ultrasonic cleaning, $Ti_3C_2\,T_s$ had a particle size of 400 to 800 nm (number average size of 40 particles based on a TEM photograph).

To the container containing the $Ti_3C_2\,T_s$-aqueous dispersion liquid (50 mg-10 mL) prepared as described above, 0.1 mL of the ferrofluid prepared as described above was added, and the mixture was mixed by a magnetic stirrer. Accordingly, a mixture was obtained which is substantially composed of $Ti_3C_2 T_s$, $Fe_3O_4$ particles and water as MXene, dielectric/magnetic nanoparticles and a liquid medium, respectively (see Table 1).

Figure 3:
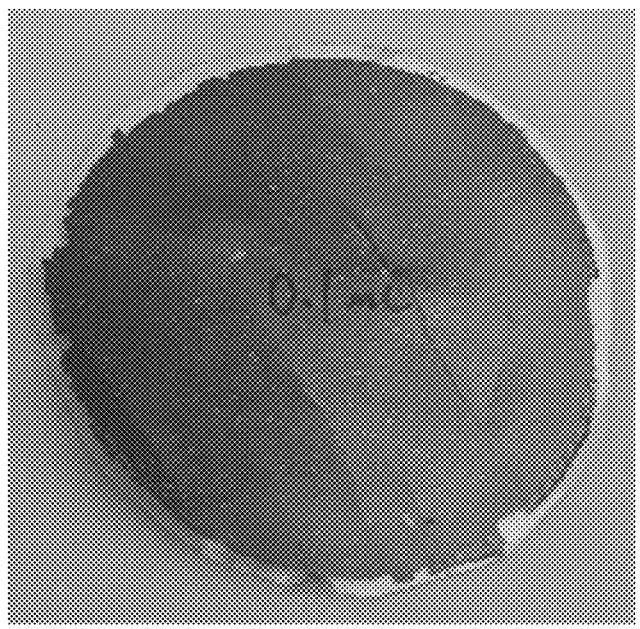
FIG. 3 is a photograph of an appearance of a film prepared in Example 1.

The mixture thus obtained was subjected to suction filtration by a filter (polypropylene membrane filter, pore diameter: 0.064 μm, manufactured by Celgard) to remove the liquid medium substantially composed of water, so that a film was obtained as a residue on the filter (see FIG. 3). The film was composed of $Ti_3C_2 T_s$ and $Fe_3O_4$ particles, and had a black appearance as shown in FIG. 3 (visually unrecognizable $Fe_3O_4$ particles are dispersed in a matrix ($Ti_3C_2 T_s$), and white spots appearing to be dispersed in appearance are spaces), being in the form of a generally circular film having a diameter of about 4 cm and a thickness of about 6 to 7 μm. The content ratio of $Fe_3O_4$ particles in this film was about 11% by weight as a calculated value.

Comparative Example 1

Figure 4:
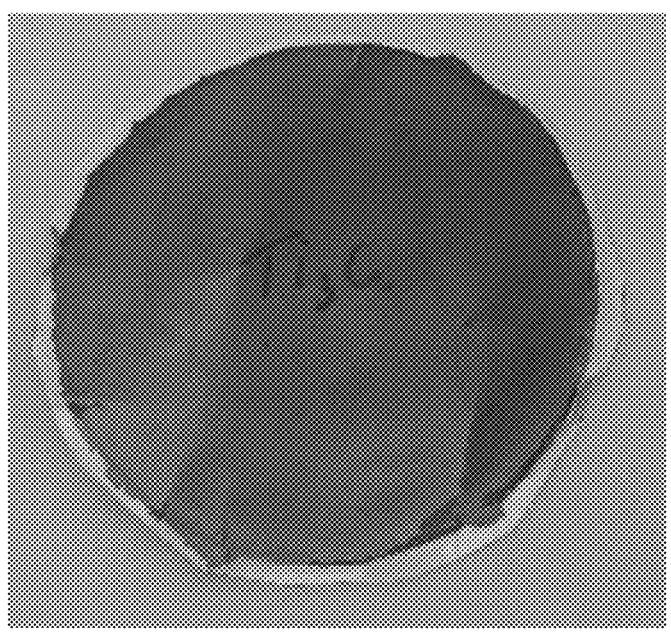
FIG. 4 is a photograph of an appearance of a film prepared in Comparative Example 1.

Except that a $Ti_3C_2 T_s$-aqueous dispersion liquid (50 mg-10 mL) was used as it was without adding ferrofluid thereto (see Table 1), the same procedure as in Example 1 was carried out to obtain a film (see FIG. 4). The film was composed of $Ti_3C_2 T_s$, and had a black appearance as a whole as shown in FIG. 4, being in the form of a generally circular film having a diameter of about 4 cm and a thickness of about 6 to 7 μm.

TABLE 1

|  | Example 1 | Comparative Example 1 |
| --- | --- | --- |
| $Ti_3C_2T_s$ | 50 mg | 50 mg |
| Water | 10 mL | 10 mL |
| Ferrofluid (=$Fe_3O_4$ particles + water) | 0.1 mL | — |

For each of the films prepared in Example 1 and Comparative Example 1, SEM images of the surface and cross-section of the film were obtained. In the film of Comparative Example 1, only layers of $Ti_3C_2T_s$ were present. In the film of Example 1, it was found that $Fe_3O_4$ particles are relatively uniformly dispersed between the layers of $Ti_3C_2T_s$.

Figure 5:
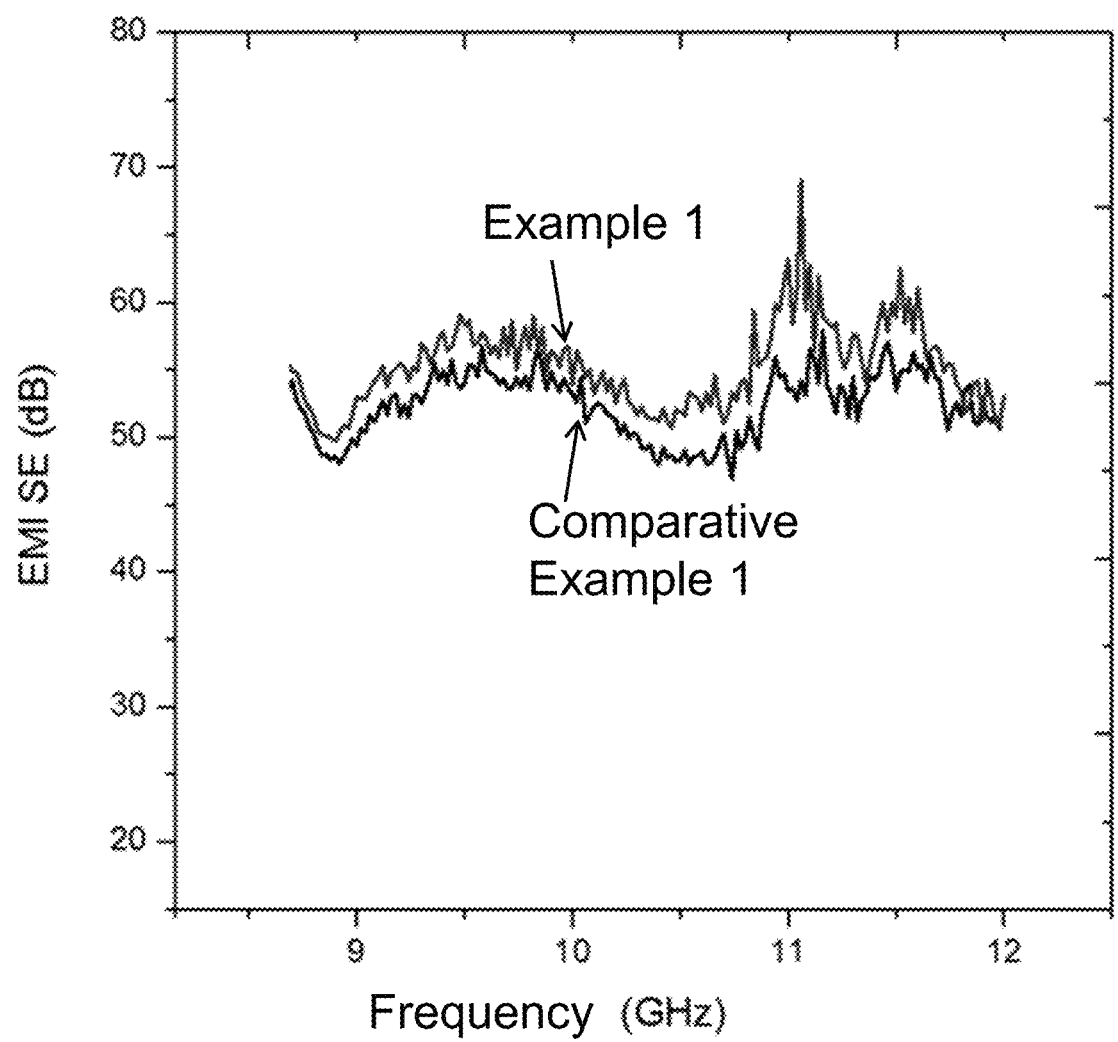
FIG. 5 is a graph showing electromagnetic shielding characteristics of the films prepared in Example 1 and Comparative Example 1.

In addition, electromagnetic shielding characteristics for each of the films prepared in Example 1 and Comparative Example 1 were measured. More specifically, a network analyzer (8720ES, manufactured by KEYSIGHT TECHNOLOGIES) was connected to an X-band-compatible waveguide was connected to an X-band compatible waveguide, and the attenuation amount (EMI SE) of a transmitted wave with respect to the frequency of an electromagnetic wave was measured. The results are shown in FIG. 5 and Table 2. In FIG. 5, the upper solid line shows the result of Example 1, and the lower solid line shows the result of Comparative Example 1. Compared with the film of Comparative Example 1, it was confirmed that EMI SE is large and the electromagnetic shielding characteristics are improved in the film of Example 1.

TABLE 2

| Frequency of electromagnetic wave (GHz) | EMI SE (dB) | |
| --- | --- | --- |
|  | Example 1 | Comparative Example 1 |
| 9 | 50 | 48 |
| 12 | 53 | 51 |

An electromagnetic shielding material according to the present invention can be used for applications of a wide range as a material for forming an electromagnetic shielding to be used for preventing a situation in which an electromagnetic wave (electromagnetic noise) is generated from an electronic device etc., and spatially transmitted, and causes damage to other or the same electronic device etc.

REFERENCE SIGNS LIST 1a, 1b, 1c $M_{n+1}X_n$ layer
3a, 5a, 3b, 5b, 3c, 5c modifier or terminal T
7a, 7b, 7c MXene layer
10 MXene (layered material)
11 dielectric/magnetic nanoparticles
13 medium
20 electromagnetic shielding material

The invention claimed is:

1. An electromagnetic shielding material comprising:
a plurality of layers, each layer having a crystal lattice represented by:

$M_{n+1}X_n$ wherein M is at least one metal of Group 3, 4, 5, 6, or 7,
X is a carbon atom, a nitrogen atom, or a combination thereof,
n is 1, 2, or 3, and
each X is positioned within an octahedral array of M, and
at least one of two opposing surfaces of said each layer of the plurality of layers has at least one modifier or terminal selected from a hydroxy group, a fluorine atom, an oxygen atom, and a hydrogen atom; and
dielectric and/or magnetic nanoparticles carried on a layer surface and/or between two adjacent layers of the plurality of layers, wherein the dielectric and/or magnetic nanoparticles are any one or a combination of two or more selected from the group of tin oxide, nickel, iron, cobalt and ferrite,
wherein the plurality of layers are arranged in a form of a film,
wherein each of the plurality of layers are aligned substantially parallel to a surface of the film, and
wherein a thickness of the film is 5 μm to 20 μm.

2. The electromagnetic shielding material according to claim 1, wherein the dielectric and/or magnetic nanoparticles are carried on the layer surface and/or between the two adjacent layers of the plurality of layers via the modifier or terminal.

3. The electromagnetic shielding material according to claim 1, further comprising carbon nanotubes.

4. The electromagnetic shielding material according to claim 1, further comprising a medium in which the layered material is dispersed together with the dielectric and/or magnetic nanoparticles.

5. The electromagnetic shielding material according to claim 4, wherein the medium comprises a hydrophilic organic binder or a precursor thereof.

6. An electromagnetic shielding material comprising:
a plurality of layers, each layer having a crystal lattice represented by:

$M_{n+1}X_n$ wherein M is at least one metal of Group 3, 4, 5, 6, or 7,

X is a carbon atom, a nitrogen atom, or a combination thereof, n is 1, 2, or 3, and each X is positioned within an octahedral array of M, and at least one of two opposing surfaces of said each layer of the plurality of layers has at least one modifier or terminal selected from a hydroxy group, a fluorine atom, an oxygen atom, and a hydrogen atom; and dielectric and/or magnetic nanoparticles carried on a layer surface and/or between two adjacent layers of the plurality of layers, wherein the dielectric and/or magnetic nanoparticles are any one or a combination of two or more selected from the group of tin oxide, nickel, iron, cobalt and ferrite, wherein the plurality of layers are arranged in a form of a coating layer for application on a base material or a member to be shielded, wherein each of the plurality of layers are aligned substantially parallel to a surface to be coated, and wherein a thickness of the film is 5 µm to 20 µm.

7. The electromagnetic shielding material according to claim 6, wherein the dielectric and/or magnetic nanoparticles are carried on the layer surface and/or between the two adjacent layers of the plurality of layers via the modifier or terminal.

8. The electromagnetic shielding material according to claim 6, further comprising carbon nanotubes.

9. The electromagnetic shielding material according to claim 6, further comprising a medium in which the layered material is dispersed together with the dielectric and/or magnetic nanoparticles.

10. The electromagnetic shielding material according to claim 9, wherein the medium comprises a hydrophilic organic binder or a precursor thereof.

* * * * *